(12) United States Patent
Brcka

(10) Patent No.: US 7,867,409 B2
(45) Date of Patent: Jan. 11, 2011

(54) CONTROL OF ION ANGULAR DISTRIBUTION FUNCTION AT WAFER SURFACE

(75) Inventor: Jozef Brcka, Loundonville, NY (US)

(73) Assignee: Tokyo Electron Limited, Tokyo (JP)

( * ) Notice: Subject to any disclaimer, the term of this patent is extended or adjusted under 35 U.S.C. 154(b) by 695 days.

(21) Appl. No.: 11/693,010

(22) Filed: Mar. 29, 2007

(65) Prior Publication Data

US 2008/0242065 A1     Oct. 2, 2008

(51) Int. Cl.
G01L 21/30 (2006.01)
C23C 16/52 (2006.01)
C23F 1/00 (2006.01)

(52) U.S. Cl. .................. 216/59; 216/67; 427/8; 427/569; 438/706; 438/710

(58) Field of Classification Search .............. 427/8, 427/569; 216/59, 67; 156/345.43; 438/706, 438/710

See application file for complete search history.

(56) References Cited

U.S. PATENT DOCUMENTS 5,451,784 A * 9/1995 Loewenhardt et al. ...... 250/305
5,565,681 A * 10/1996 Loewenhardt et al. ...... 250/305
7,572,737 B1 * 8/2009 Dhindsa .................. 438/714

OTHER PUBLICATIONS

I R Woodworth et al. "Experimental an dtheoritical study of Ion distributions near 300 micrometer tall steps on rf-biased wafers in high density plasmas" J.Vac.Sci. Technol. A 21(1) Jan./Feb. 2003, p. 147-155.*

* cited by examiner

Primary Examiner—Shamim Ahmed
(74) Attorney, Agent, or Firm—Wood, Herron & Evans, L.L.P.

(57) ABSTRACT

A manufacturing method and apparatus for IC fabrication controls the ion angular distribution at the surface of a wafer with electrodes in a wafer support that produce electric fields parallel to the wafer surface without disturbing plasma parameters beyond the wafer surface. The ion angular distribution function (IADF) at the wafer surface is controlled for better feature coverage or etching. Grid structure is built into the substrate holder within the coating at the top of the holder. The grid components are electrically biased to provide electric fields that combine with the sheath field to distribute the ion incidence angles from the plasma sheath onto the wafer. The grid can be dynamically biased or phased to control uniformity of the effects.

20 Claims, 14 Drawing Sheets

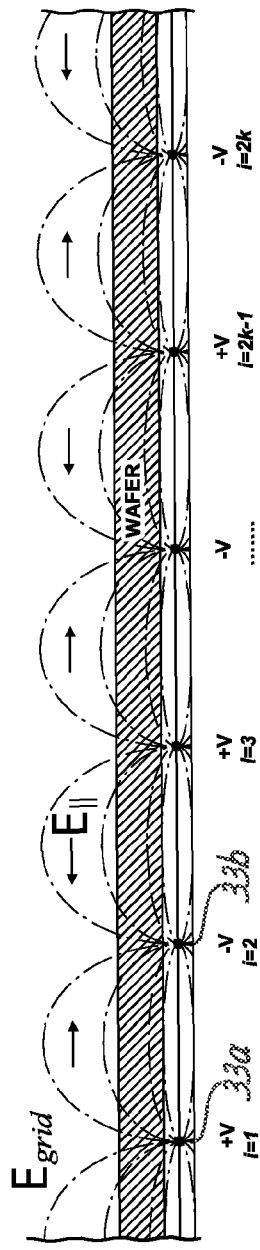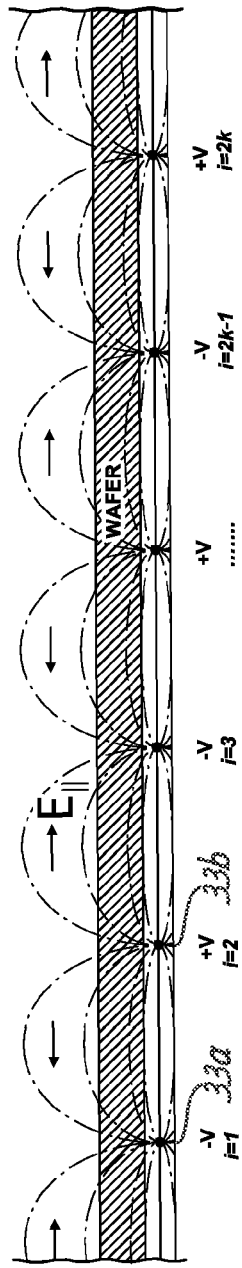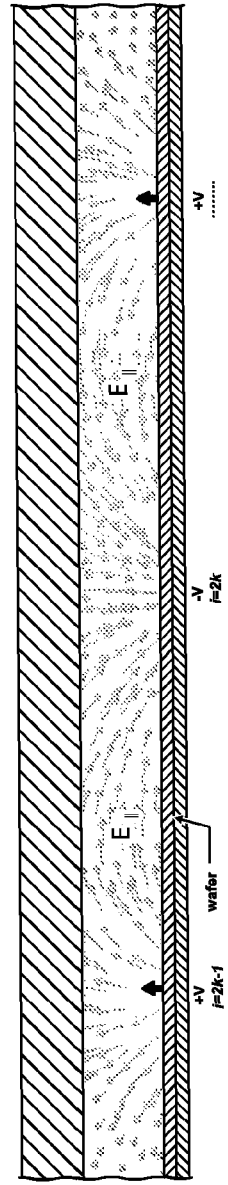

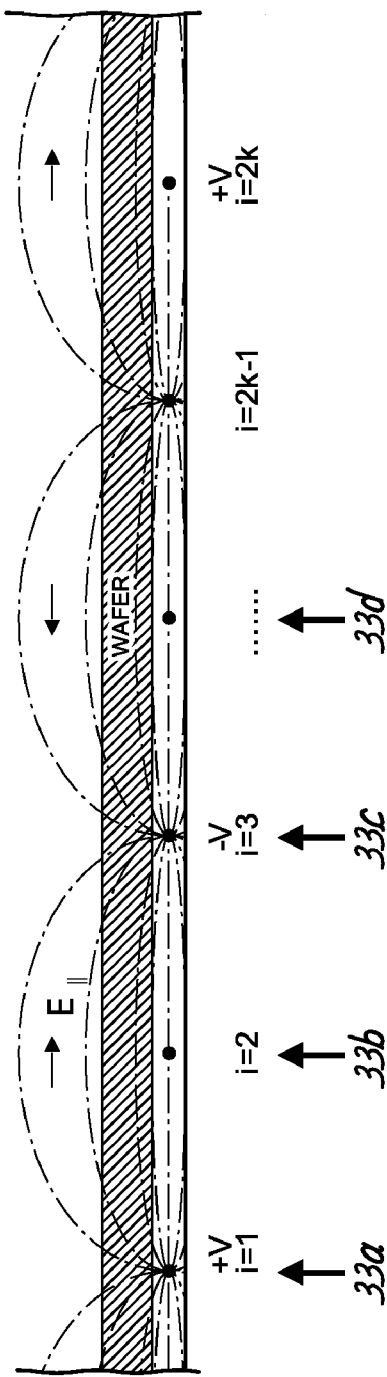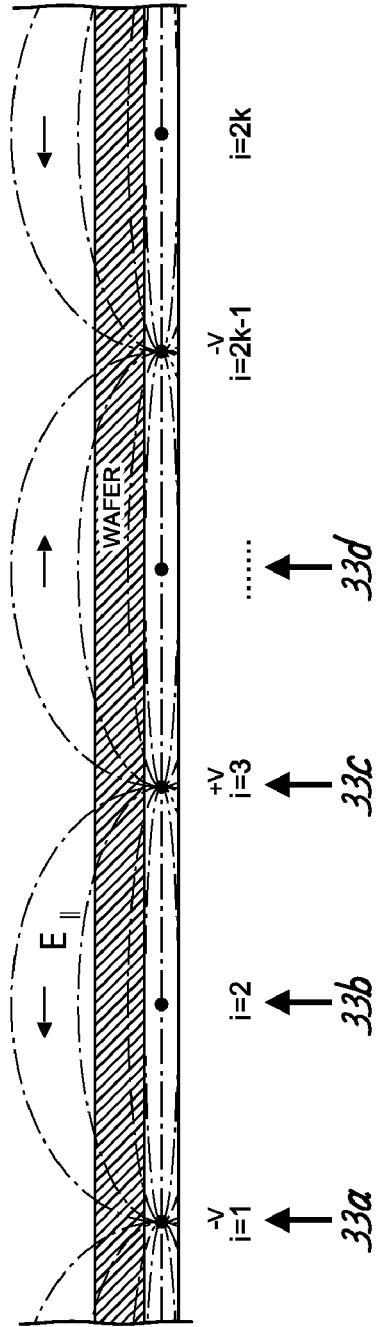

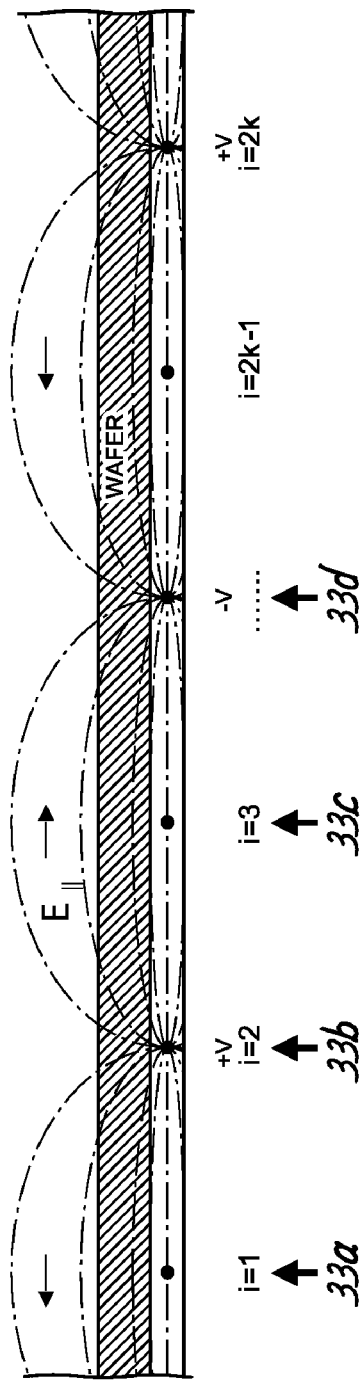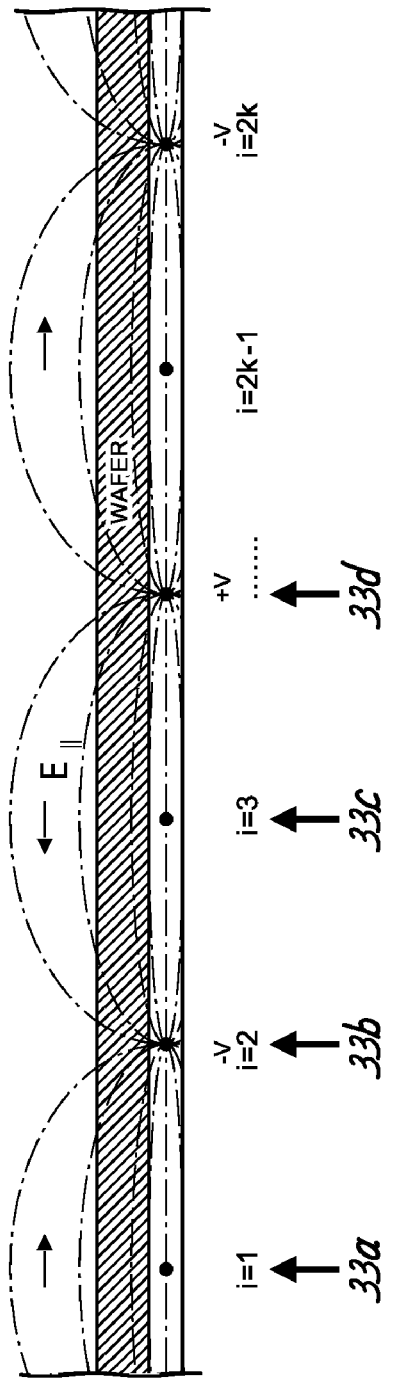

CONTROL OF ION ANGULAR DISTRIBUTION FUNCTION AT WAFER SURFACE

The present invention relates to integrated circuit (IC) fabrication and to the control of the ions onto the surface of a wafer during processing. More particularly, the invention relates the control of the angles of incidence of ions onto a wafer surface during plasma processing of a semiconductor wafer held on RF-biased wafer holders in processing tools for thin film material processing.

BACKGROUND OF THE INVENTION

In plasma processing systems, semiconductor wafers are placed on the RF biased substrate holders, such as electrostatic chucks (ESCs) or chucks provided with mechanical wafer clamps, where the wafers are exposed to ions from the plasma. The energy of the ions incident on the wafers from the plasma is typically independently controlled by varying the bias power level, while the ion density is usually controlled by control of an independent plasma source. The plasma source can be, for example, an inductively coupled plasma (ICP) source, a dual capacitively-coupled plasma source (CCP) having a secondary top electrode biased at another RF frequency, a helicon plasma source, a microwave plasma source, a magnetron, or some other independently operated source of plasma energy.

An RF biased ESC operates as CCP source in which a wafer having a surface to be etched or coated is placed on an electrode. The wafer support electrode is typically coupled to an RF generator through a blocking capacitor and an impedance matching unit, which does not allow real current to flow from the electrode to the RF generator. FIG. 1A is a diagram that represents a bulk plasma 10 in a plasma processing chamber in which a substrate 15 is supported on a substrate support 14 for processing. A plasma sheath 12 occupies a boundary between the plasma 10 and the surface of the wafer 15. Between the bulk plasma 10 and the plasma sheath 12 is a region that can be referred to as the plasma presheath 13.

At the plasma-to-surface boundary, electrons escape from the plasma and charge the wafer surface with a negative charge. This occurs because the plasma and the biased ESC electrode will find a condition at which electron current reaching the electrode from the plasma exactly balances ion current averaged over one RF cycle. Since electrons are more mobile than ions, the electrode acquires a negative potential that will limit electron current and encourage positive ion current from the plasma to the wafer surface. This negative potential is called the self-bias voltage and results in an energetic ion bombardment of the surface from the plasma, which can, for example, etch the wafer surface. Since the wafer is not formed of a conductive material, and since the substrate holder is usually coated with a dielectric or insulating material, the actual self-bias on the conductive portion of holder closer to the RF source is more negative than the self-bias on the top of the support. Changing applied RF bias power can control the ion bombardment energy and can partially affect the ion flux as well.

The initial kinetic energy of the ions in bulk plasma 10 is related to the gas temperature and, typically, is within a range of 0.05 to 0.1 electron volts (eV). Ion motion in the plasma 10 is random due to collisions with background gas atoms or molecules. Also, a directional component may be present in the plasma 10 due to ambipolar diffusion of the ions in an ambipolar electric field inside the plasma 10, which is usually small, approximately 0.1 to 1 V/cm, but which can contribute to asymmetry in feature processing by bombarding ions. Before ions enter the sheath 12 from the plasma 10, they gain some directional energy within the presheath 13. This energy is approximately half the electron temperature $T_e$ of the plasma 10. Sheath theory tells us that ions enter plasma sheaths with a so-called Bohm velocity, which is proportional to $kT_e/m_i$, where $m_i$ is the mass of the ion. In an actual plasma sheath 12, ions are accelerated by a sheath voltage E that is the difference between the plasma voltage and the bias voltage on the wafer 15. The sheath voltage E is much larger than the energy gain in the presheath 13, and is much-much larger than the kinetic energy of the ions in the bulk plasma 10.

Due to the combined random kinetic energy gained in the bulk plasma 10 and directional energy gained within the presheath 13 and sheath 12, ions will hit the surface of the wafer 15 with a particular angle, or in a particular distribution of angles. This distribution of angles can be referred to as the Ion Angular Distribution Function (IADF) 16, which can be defined for given process conditions. In typical systems of the prior art, most of the ions are within a small angle cone 17 of less than about 20 degrees when pressures are in the range of 1 milli-Torr (mTorr) to several 100 s of milli-Torr.

Experimental data from literature show the IADF at the wafer 15 in an ICP plasma process to be approximately as illustrated as curve 18 in FIG. 1B, shown for pressures at about 2 mTorr, to that as illustrated as curve 19 at pressures at about 50 mTorr. The graphs are plots of the angular distribution of ions incident at a given point on the surface of a wafer, with the angle being measured relative to a vector normal to the wafer surface at the given point. The graph of FIG. 1B shows the distribution at angles measured in a vertical plane through the given point. This distribution is not necessarily the same in every direction or in every vertical plane through the point, and may therefore be regarded as a three-dimensional function of an angle $\phi$ to the normal, through a plane oriented at some angle $\theta$ to a reference line on the wafer's surface.

Furthermore, the IADF is not necessarily the same at every point on the surface of the wafer, and can vary across the surface of the wafer. Therefore, the IADF can also be considered as a function of $\phi$ and $\theta$, that additionally varies as a function of the x,y coordinates on the wafer surface, or more conveniently, of the R,$\Theta$ coordinates of the points on the wafer surface. It is not uncommon to experience different ion incidence angles between the center and the edge of a wafer, for example.

The IADF plays an important role in feature coverage in ionized physical vapor deposition (IPVD) and other ion-controlled deposition and etching processes. Control of IADF to produce ideal feature coverage has been a challenge in the prior art. In the prior art, there is no independent process variable that allows direct control of the IADF at the wafer surface that is in contact with the plasma that leaves basic plasma process conditions unchanged.

Accordingly, there is a need for control of the ion angular distribution function (IADF) in IC plasma processes.

SUMMARY OF THE INVENTION

An objective of the present invention is to provide a method and apparatus for controlling the IADF at a wafer surface during plasma processing. A particular objective of the invention is to provide IADF-controlled plasma processing, and particularly IADF control that is independent of wafer holder RF bias power and frequency and of operating pressure.

One objective of the invention is to control the IADF at one or more given points on the surface of a wafer, for example, to deliver ions to sidewall surfaces of features on a wafer. A further objective of the invention is to control the variation of IADF across the surface of a wafer, either to vary the IADF function across the wafer surface or to make the IADF uniform across the wafer surface, for example, to compensate for the effects of conditions that would undesirably affect IADF.

BRIEF DESCRIPTION OF THE DRAWINGS

FIGS. 4A and 4B are diagrams of electric fields parallel to a wafer surface that can be produced in a sheath by the structure of FIG. 3.

FIG. 4C is an enlarged portion of the diagram of FIG. 4A showing a simulation of the sheath electric fields.

FIGS. 9A-D are diagrams, similar to FIGS. 4A and 4B showing electric fields produced in a sheath field according to some embodiments of the invention.

DETAILED DESCRIPTION

Figure 1A:
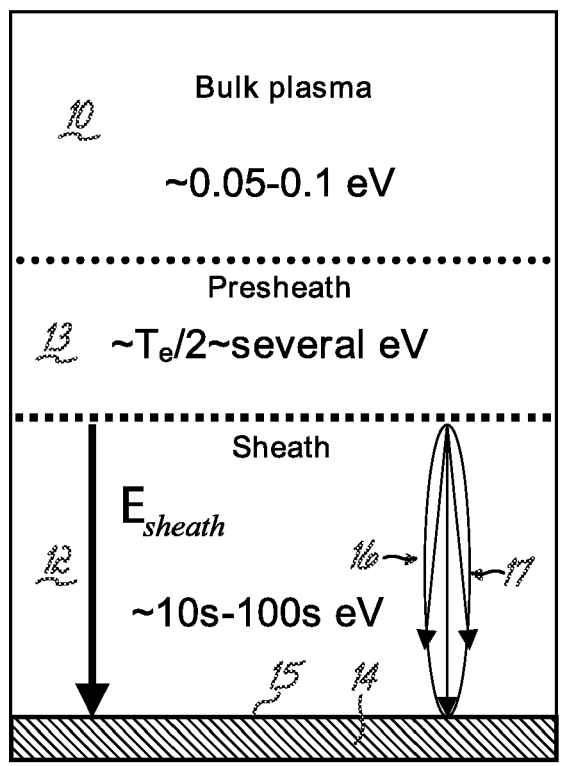
FIG. 1A is a diagram illustrating a bulk plasma, a presheath and a plasma sheath in a typical plasma processor of the prior art.
Figure 1B:
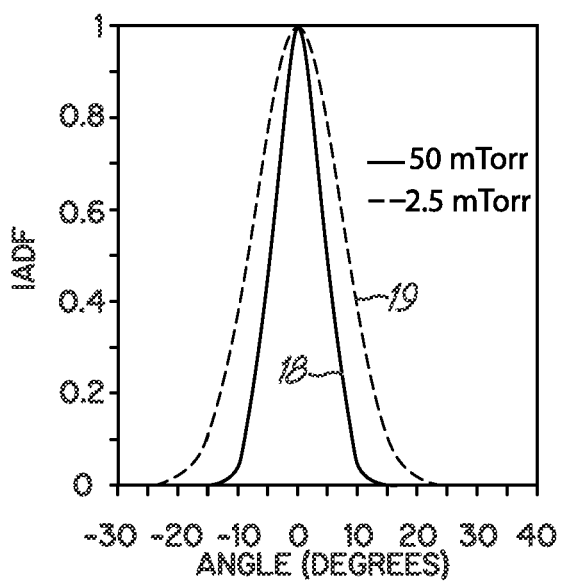
FIG. 1B is a graph of typical ion angular distribution functions (IADF) in an ICP plasma represented by FIG. 1A at 2 and 50 mTorr.
Figure 2A:
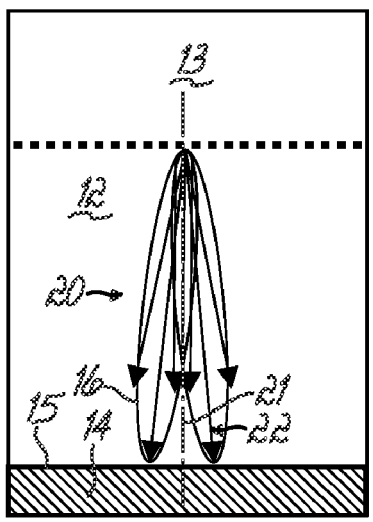
FIG. 2A is a diagram showing preferred ion angular incidence vectors for an enhanced sidewall coverage according to certain exemplary embodiments of the present invention.
Figure 2B:
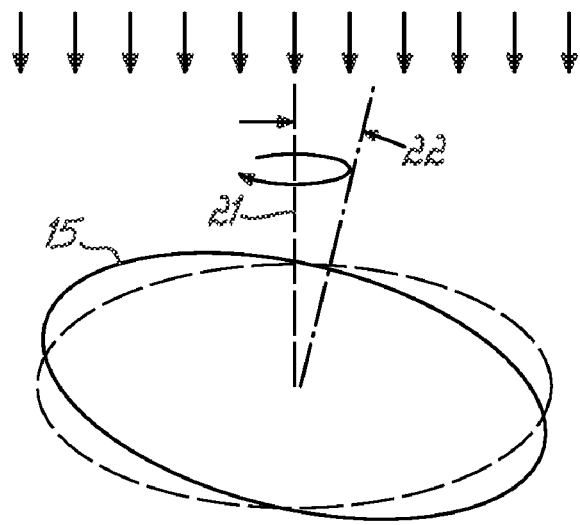
FIG. 2B is a diagram of one prior art technique for producing ion angular incidence of FIG. 2A.

An example of an ion angular distribution function (IADF) 20 produced by the present invention that creates increased sidewall coverage of features in ionized physical vapor distribution (IPVD) is shown in cross-section in FIG. 2A under conditions typical for IPVD. The IADF 20 is not typical of current prior art plasma processing. Mathematically, the IADF 20 can be described as a rotation of the natural IADF 16 (FIG. 1A) at certain angle 22 around an axis 21 that is perpendicular to the surface of the substrate 15, as illustrated in FIG. 2B. One such IADF 20 might, for example, be that produced in a vacuum process in which a well-collimated ion beam impinges along the axis 21 on the surface of a wafer 15 that is inclined at the angle 22 to the axis 21 and is rotating around the axis 21, where the process occurs in high vacuum to yield a very low dispersion of the ion beam. The IADF 20, so produced, is compared to the IADF 16 by curves 23 and 24 in FIG. 2C, in which IADF 20 is represented by curve 23 for an angle 22 of 10 degrees and by curve 24 for an angle 22 of 20 degrees.

Figure 2C:
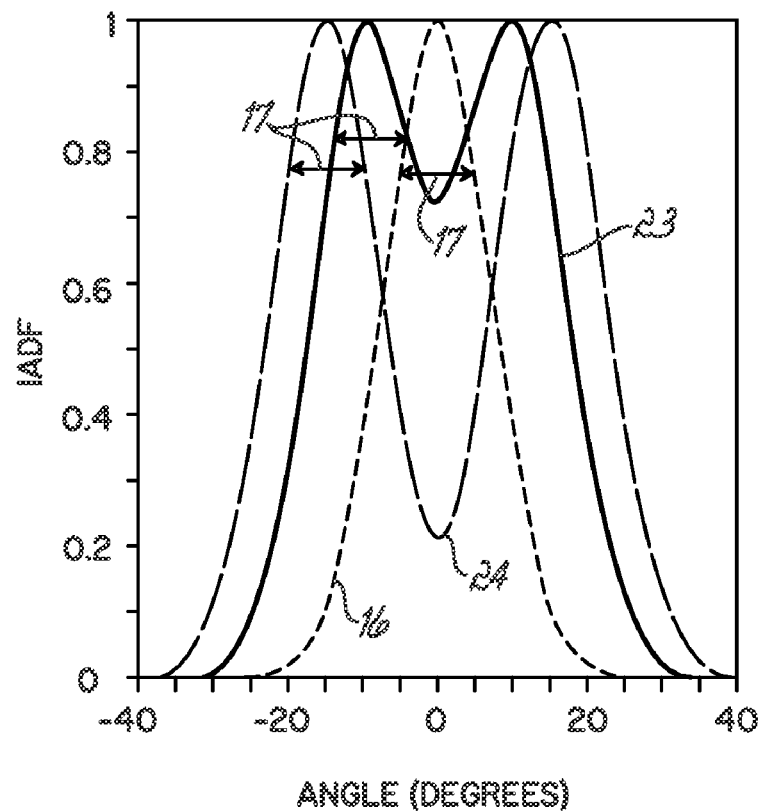
FIG. 2C is a graph of an IADF with peaks at angles of 10 degrees and 20 degrees from perpendicular to the surface of a wafer.

FIG. 2C represents an ideal situation with the effects of reactive gas background, plasma chemistry, etc., excluded. But the performance of systems having such properties can be enhanced by employing techniques that would alter the IADF from that of IADF 16 to that of IADF 23 or 24. In plasma processing, a parameter that has a noticeable impact on the IADF is background gas pressure. As curves 23 and 24 demonstrate, the lower the pressure, the smaller a cone angle 17. IADF is also affected by the biasing RF frequency and power, but these also have an impact on the Ion Energy Distribution Function (IEDF) making bias frequency and power in many circumstances impractical for IADF control due to their adverse impact on the processing rates, selectivity, and surface chemistry, for example.

Embodiments of the invention may be applied to a generic plasma processing system having a vacuum chamber, one or more plasma sources (CCP, ICP, magnetron, etc.) with appropriate RF components (matching networks, generators, probes, etc.), a wafer holder, biased or unbiased by RF or DC voltage sources, a gas flow system, a vacuum pump system, and other components typical of plasma processing systems. Plasma in such a system is generated by the plasma sources. A self-bias potential is created at the wafer surface, which potential, being negative relative to the plasma potential, causes an energetic ion bombardment of the wafer surface. With such a system, IADF can be initially determined from the background gas pressure and the RF frequency and biasing power at the substrate holder.

Figure 3:
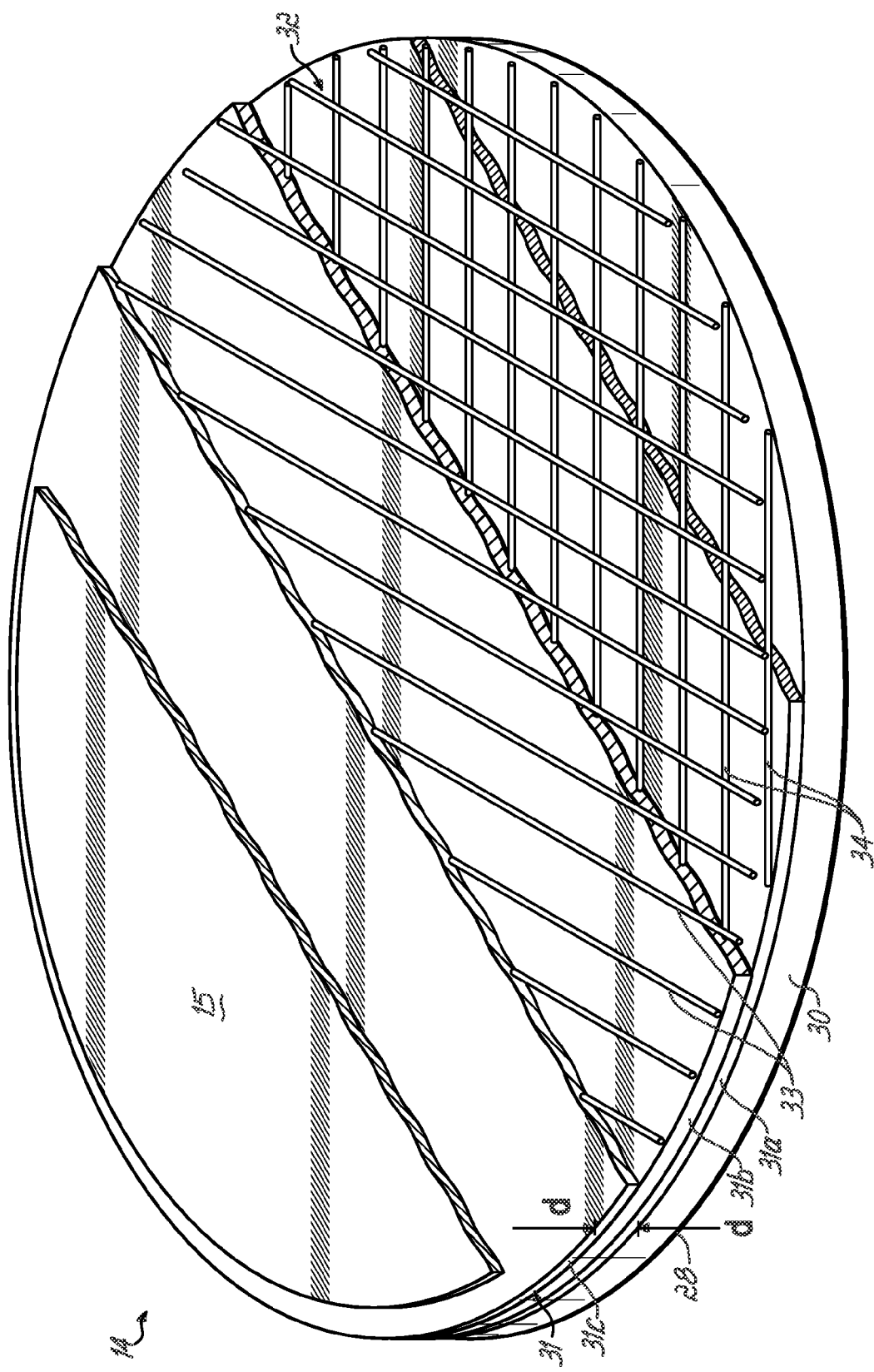
FIG. 3 is a perspective view of biasing grid structure for a wafer support for IADF control according to one embodiment of the present invention.

According to an embodiment of the invention illustrated in FIG. 3, a substrate holder 14 is provided with IADF control structure 28 that includes a chuck body or electrode 30, which may be an electrostatic chuck. The chuck is covered by a dielectric or insulating material 31, for instance $Al_2O_3$, $SiO_2$, or other ceramic material, having a total thickness $d_T$, as illustrated in FIG. 3. Within the dielectric material, conductive grid structure 32 is incorporated, for example, as two-layers of parallel conductors 33, 34 intersecting in a rectangular manner. The parallel conductor of the layers 33 and 34 are equally spaced and oriented in respective x- and y-directions. The dielectric layer 31 may be formed of three layers $31a$, $31b$, $31c$, between which are clamped the two conductor layers 33 and 34.

The individual conductors of each of the layers 33, 34 are biased at controllable electric potentials according to certain schemes. The biasing schemes may be such that two neighboring conductors of each layer 33 or 34 create electric fields that have components parallel to the surface of the wafer 15, as illustrated in FIGS. 4A and 4B. Alternating potential can be applied to all odd conductors (2k−1) 33a of layer 33 (FIG. 4A), for example, and same signal but with opposite phase shift ($\Delta\Phi=\pi$) or otherwise inverted can be simultaneously applied to all even conductors (2k) 33b of the layer 33 (FIG. 4B). That is, for x-axis orientation conductors 33, voltages on conductors i=1, 3, 5, ..., 2k−1, ... equal $V_x^{2k-1}=V_{x0}\sin(\omega t)$, and voltages on conductors i=2, 4, 5, ..., 2k, ... equal $V_x^{2k}=V_{x0}\sin(\omega t+\pi)=-V_x^{2k-1}$. Similarly, the same alternating potential scheme can be applied to all odd conductors 34a of layer 34 with inverted signals applied to all even 34b conductors of layer 34.

Figure 7:
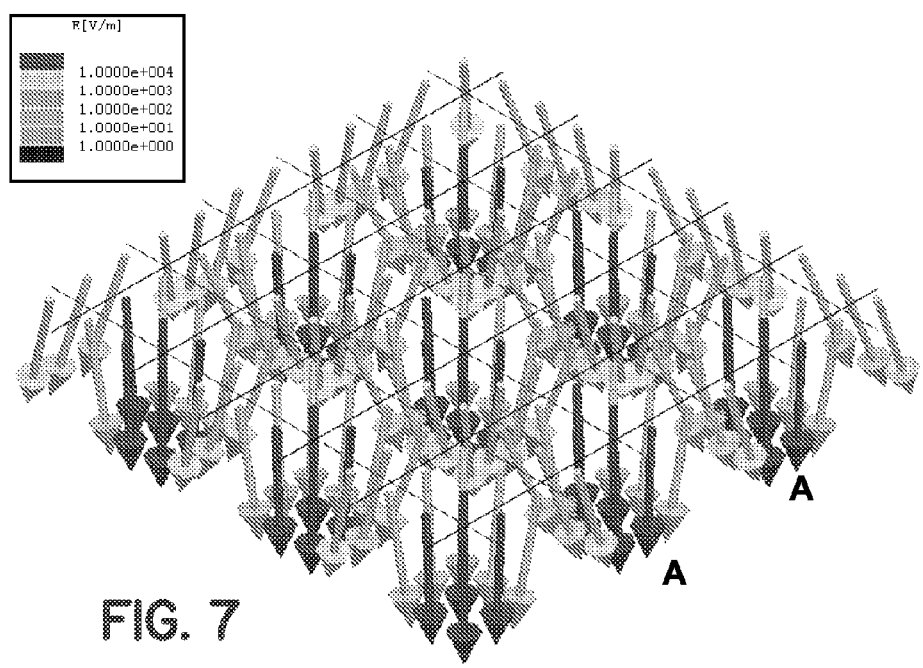
FIG. 7 is a simulation diagram showing a focusing effect of electric fields produced by certain embodiments of the IADF control structure of FIG. 3.

Writing the expressions in more generalized form including an x-to-y phase shift $\Delta\Phi_{xy}$, the equations will appear (using y-axis equations as an example) as voltages on conductors j=1, 3, 5, ..., 2k−1, ... equal to $V_y^{2k-1}=V_{y0}\sin(\omega t+\Delta\Phi_{xy})$, and voltages on conductors j=2, 4, 5, ..., 2k, ... equal to $V_y^{2k}=V_{y0}\sin(\omega t+\pi+\Delta\Phi_{xy})=-V_y^{2k-1}$. When $\Delta\Phi_{xy}=0$ the electric field in the sheath 12 will focus spatially as shown in FIG. 7, that is, into individual spots in the manner of a "focus-defocus" action. The phase differences $\Delta\Phi_{xy}=\pi/2$ will generate a sequence of focused sheath E-field vectors into lines in the x-direction with transition into focused sheath E-field vectors into lines in the y-direction at frequency $2\pi\omega$. This will generate additional motion into the sheath E-field that is an azimuthal component of the E-field at a given point on the surface of the wafer in a local coordinate system centered at the point in question.

FIGS. 4A and 4B demonstrate the electric fields in the direction of their components parallel to the wafer surface. For simplicity, the electric field components due to the plasma and wafer self-bias potentials are not shown in FIGS. 4A and 4B. For illustration purposes, the results of 3D electrostatic simulation of the electric fields between two conductors of either of the conductor layers 33 or 34 are enlarged and shown in FIG. 4C. The examples use the same amplitudes and frequencies for the signals on the two sets of grid wires 33 and 34. While this is the most likely use, particularly where the wires of both wire sets are equally spaced, these parameters can be varied to accommodate asymmetrical wafer or chamber conditions. Variable distance between individual conductors could require also adjusting potential amplitude to produce desired values of the electric fields across the whole wafer area. Providing different potential amplitude for each conductor, while usually less practical, may be useful for specific geometries, such as to accommodate effects at the edge of the wafer.

Figure 5A:
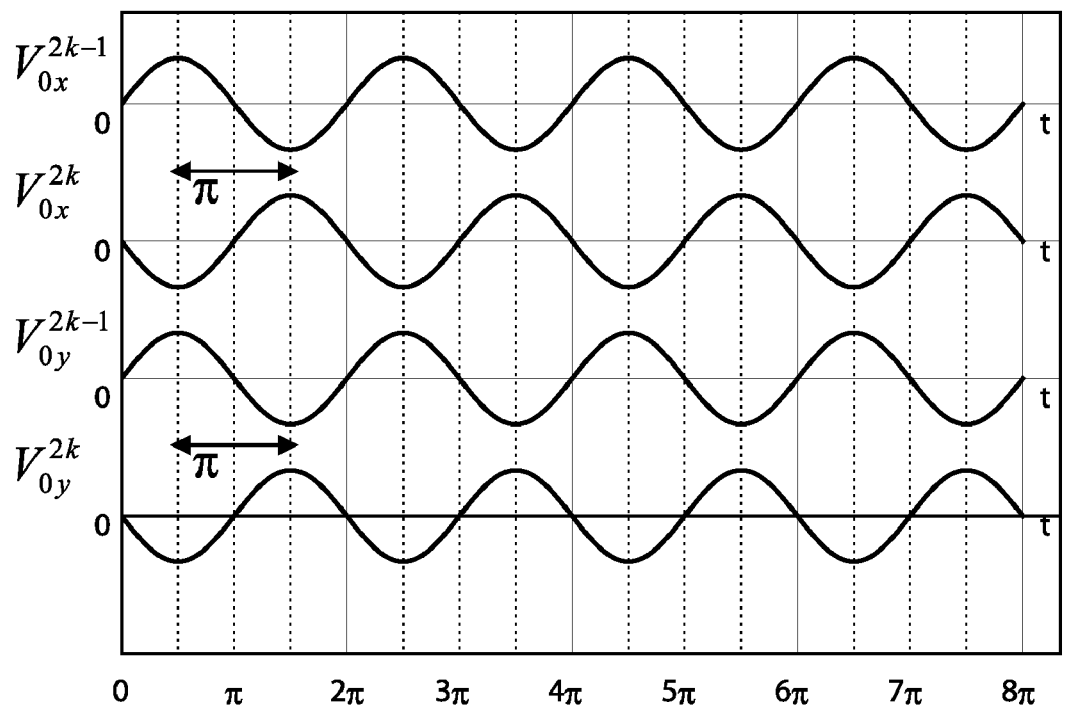
FIG. 5A is a graph showing certain versions of signals that can be used for energizing grid wires to produce the fields of FIGS. 4A-4C.
Figure 5B:
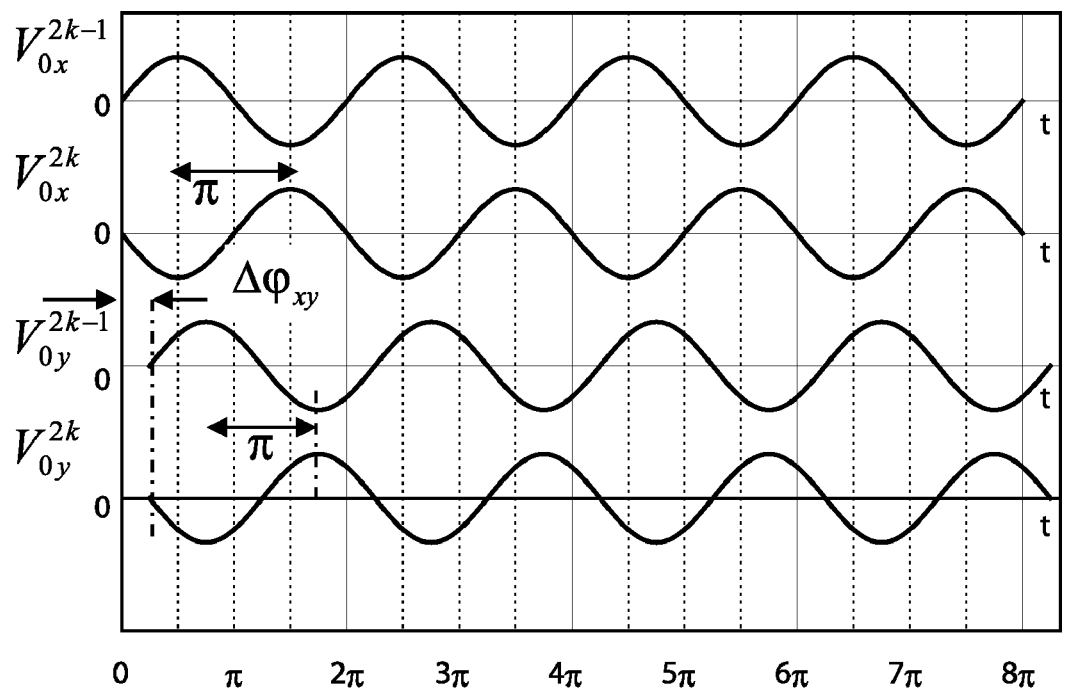
FIG. 5B is a graph, similar to FIG. 5A, but showing the signals of x direction grid conductors phase shifted relative to the y direction grid conductors.

Signal shapes and phasings for pairs of conductor of the set 33 in the x-direction and for pairs of conductors of the set 34 in the y-direction are shown in FIGS. 5A and 5B, which illustrate principles that can be employed in various embodiments of the invention. Alternating harmonic or sinusoidal signals are often the most practical, though other forms of signal may be implemented, including pulsed signals, rectangular or triangular wave shape signals, etc. The signals should be selected to produce a substantial electric field parallel to the wafer surface, which is achieved by applying regular and inverted signals on alternating wires. The term "regular and inverted signals" is a more general term that includes harmonic signals for the respective (2k) and (2k−1) parallel conductors. Further, alternating wires need not be adjacent wires, as will be seen in examples described below.

Examples of the signals for pairs of conductors in each of the x- and y-directions are shown in FIG. 5A. Phase shift is shown between two (2k) and (2k−2) parallel conductors. For simplicity, in FIG. 5A, there is no phase difference between the signals in x- and y-direction ($\Delta\phi_{xy}=0$) and the signal amplitudes on all the grid wires is the same as are the wire spacings in FIG. 5A. However, arbitrary phase difference between signals in the x- and the y-directions can be utilized. For example, FIG. 5B shows the signals on the y grid inverted but shifted relative to the phase on the x grid.

Figure 6A:
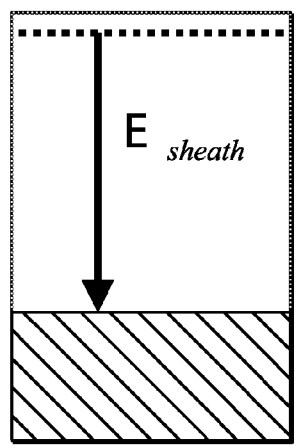
FIGS. 6A-D are diagrams of ion incidence vectors at particular points on a wafer without and with parallel electric fields produced by the signals of FIGS. 5A and 5B.
Figure 6B:
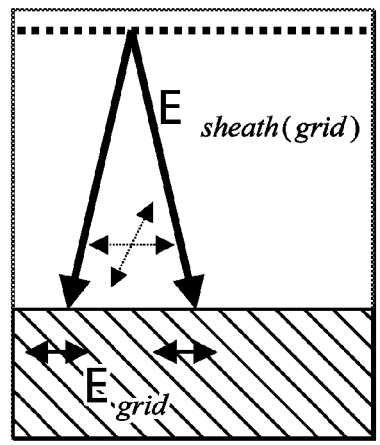

Some of the effects of phase shifting can be understood with reference to FIGS. 6A-D and 7. When the phase difference between the x and y conductors is zero ($\Delta\Phi_{xy}=0$), the electric field in the sheath will focus spatially into individual spots in a "focus-defocus" action as a result of a change of the radial component of E-field in a coordinate system local to each spot. At zero phase difference between the x- and y-directions, the E-field in the sheath will be pulsing between a focused and unfocused status. The transverse E-field component will create a "spot-like" pattern on the wafer. Only the local radial component of the transverse E-field will change according to $2\pi\omega t$, with the local azimuthal component being zero, as illustrated in FIGS. 6A and 6B, respectively, depending on the location on the wafer relative to the grid wires. This is shown in the top view by the solid arrows in FIG. 6D, where in the electric field will be focused in solid spots that are labeled A and de-focused from A into the open spots that are labeled B. The identical situation will be produced also for $\Delta\phi_{xy}=\pi, 2\pi, 3\pi, \ldots$.

Figure 6C:
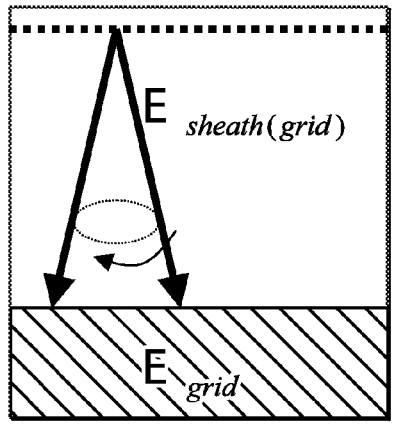
Figure 6D:
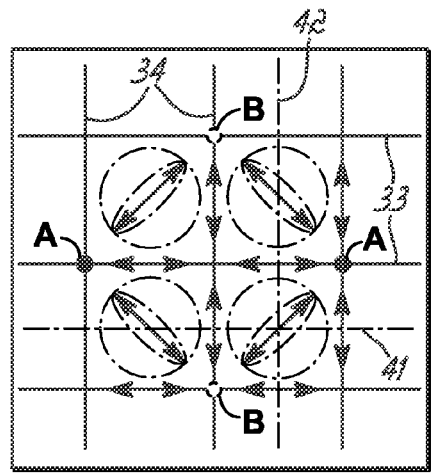

The introduction of phase difference will generate a pattern of a focused E-field in the sheath with its lines in the x-direction, with a transition into a focused sheath E-field with lines in a y-direction directly above the grid wires, but with a non-zero azimuthal or rotational component of E-field at each spot midway between the grid wires in local coordinate system, as illustrated in FIG. 6C. The motion of the vectors will range from circular ($\Delta\phi_{xy}=\pi/2$), to elliptical (when $\Delta\phi_{xy}$ is non-zero or different from a multiple of $\pi/2$), as illustrated by the broken lines in FIG. 6D, to linear ($\Delta\phi_{xy}=0$), depending on phase angle and position relative to the grid.

In plasma the combination of the sheath electric field ($E_{sheath}$) and superimposed field from the grid ($E_{grid}$) will create specific ($E_{sheath(grid)}$) field as it is shown in FIGS. 6A-C. In the 3D simulation of the static electric field for the portion of a rectangular grid shown in FIG. 7, the odd number (2k−1) conductors were biased by +50 V and the even number conductors (2k) by −50 V. The plasma potential was assumed to be +20 V, and the self-bias at the electrode was −50 V. One can see that ions experience a focusing effect into areas "A" between the positively biased conductors.

Frequency differences between x and y conductors will add additional rotations and variations, particularly at areas were the elliptical patterns are present. Such phase and frequency differences are not necessary to the invention, but can be used in connection with the invention, and may be helpful in some applications, and can be helpful, for example, to smooth or soften grid pattern effects across a wafer.

Application of the principles described above can be used to control or improve sidewall coverage at selected places on a wafer. Without more, however, such applications do so in a grid-like pattern can be over the wafer. For example, the fields shown in FIGS. 4A-C can exist along the lines 41 or 42 in FIG. 6D, which are between and equidistant from the oppositely biased conductors. This is useful for demonstrating principles of various embodiments of the invention, and for certain special applications.

For example, with x- and y-conductors phased at π/2 relative to each other, a symmetrical IADF as in FIG. 2A or 6C will be produced at the centers of each of the squares defined by the perpendicular grid wires of sets 33 and 34. But off the centers of the squares and directly under the grid wires, the effects will not be so symmetrical. So, unless a process can advantageously utilize such patterned IADF control, such as where dies on the wafer correspond to the grid pattern, additional application of other principles of the invention might be preferable.

The principles described above can be used to control side wall coverage, or otherwise control IADF in plasma processes, in a uniform manner. By switching, shifting, or otherwise moving the fields, produced by biasing the conductors as described above, over the wafer in such a way that the integrated or average field parallel to the wafer is the same at all points and in all directions over the wafer, a uniform effect can be achieved. Some embodiments for doing so are described below.

Referring to FIGS. 4A-C and 6D, in positions exactly above the grid conductors, the electric field ($E_{sheath(grid)}$) has a very small component parallel to the wafer ($E_\parallel$~0). By replacing each of the grid wires in the examples described above with a pair of wires, and applying potentials alternately between the two, $E_\parallel$ can be made effectively uniform across the wafer on a time averaged basis. By doing so, another set of grid wires is provided midway between the wires of the original set, and the bias potential is switched between them. In this way, $E_\parallel$ is alternately switched between zero and maximum over the wires of each set, producing an uniform average $E_\parallel$ over the wafer.

Figure 8A:
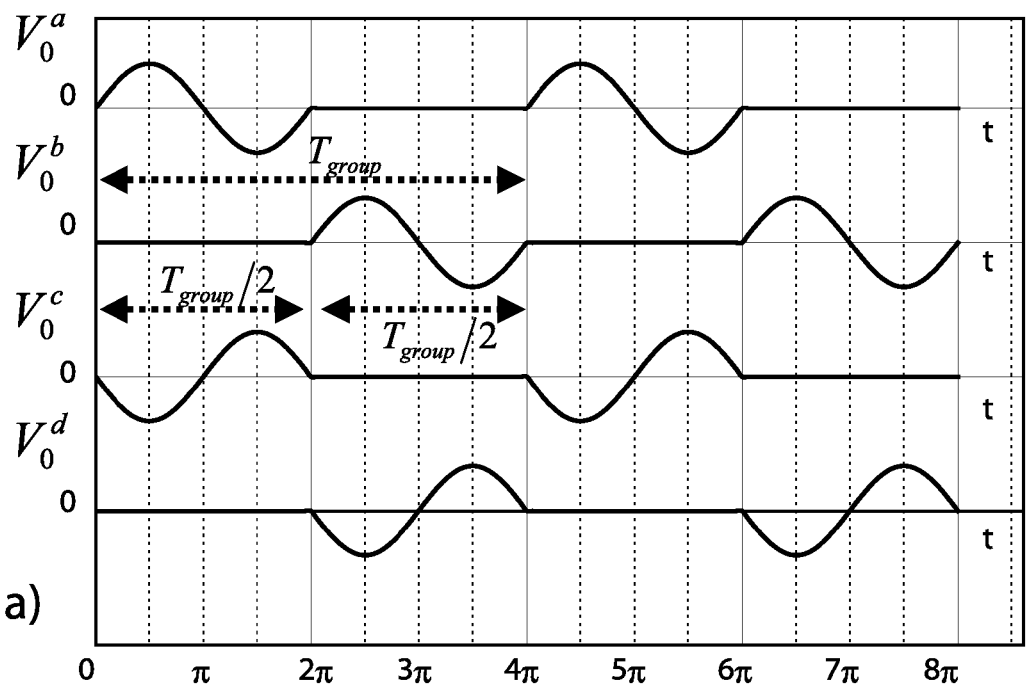
FIGS. 8A and 8B are graphs, similar to FIG. 5A, showing signals for energizing the structure of FIG. 3 according to certain embodiments of the present invention.
Figure 8B:
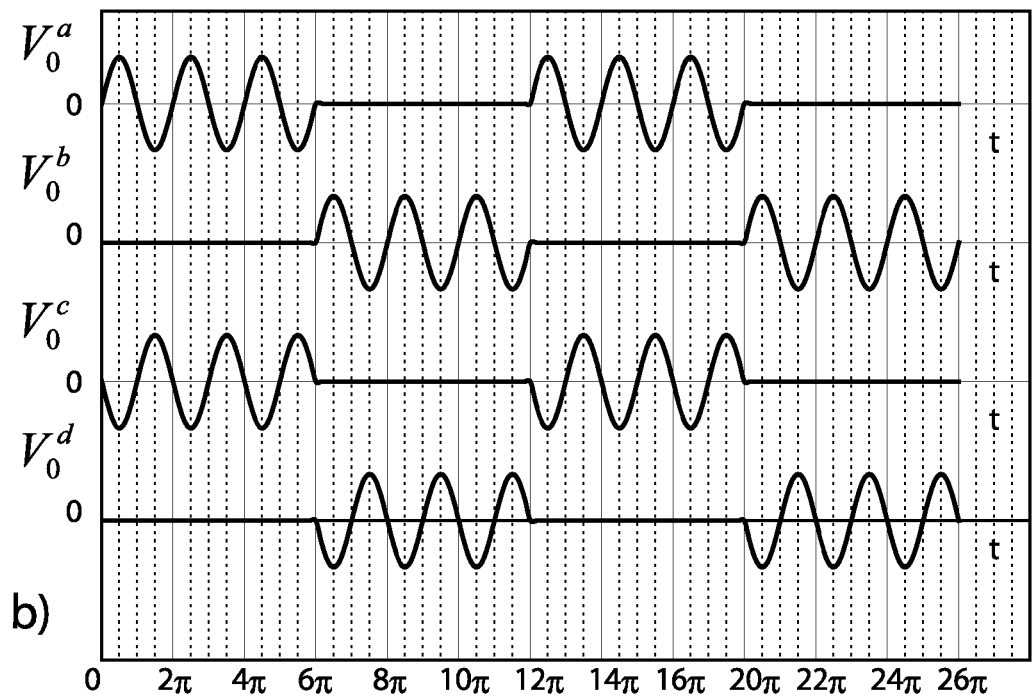

That is, instead of inverting the bias on adjacent conductors of a set, a signal sequence is applied for groups of four adjacent conductors in a way that provides homogeneous and non-zero average $E_\parallel$ above the whole wafer or an area thereof. The signal shape, phasing and conductor group is illustrated in FIGS. 8A and 8B. The signals in FIG. 8A are shown being switched after each single cycle, though multiple cycles per switching period can be used as well, as illustrated in FIG. 8B. In FIG. 9, it can be seen that each position immediately above a grid conductor is exposed for some period of time to an electric field parallel to wafer, $E_\parallel$.

For example, the individual conductors to which the signals of FIG. 8A are applied in each of the layers 33, 34 can be considered as arranged in groups of four conductors, 33a, 33b, 33c and 33d, and 34a, 34b, 34c and 34d, respectively. The $E_\parallel$ fields produced are those shown in FIGS. 9A, 9B, 9C and 9D, respectively. The signal shape, as illustrated in FIG. 8A, can be described as follows:

for x-axis conductors:
 i=1, 5, 9, . . . , a, . . . $V_x^a$ (Δϕ=0)
 i=2, 6, 10, . . . , b, . . . $V_x^b = V_x^a$ (Δϕ=π)
 i=3, 7, 11, . . . , c, . . . $V_x^c = V_x^a$ (Δϕ=0)
 i=4, 8, 12, . . . , d, . . . $V_x^d = V_x^a$ (Δϕ=π)

for y-axis conductors:
 j=1, 5, 9, . . . , a, . . . $V_x^a$ (Δϕ=0+Δϕ_{xy})
 j=2, 6, 10, . . . , b, . . . $V_x^b = V_x^a$ (Δϕ=π+Δϕ_{xy})
 j=3, 7, 11, . . . , c, . . . $V_x^c = V_x^a$ (Δϕ=0+Δϕ_{xy})
 j=4, 8, 12, . . . , d, . . . $V_x^d = V_x^a$ (Δϕ=π+Δϕ_{xy})

The expressions for y-axis conductors are written more generally to allow for phase shift between x- and y-axis conductors. Identical amplitudes can be used, particularly grids conductors are equidistant in both directions. A single source can be used with a phase shifter and signal inventor to bias the entire grid.

Figure 10:
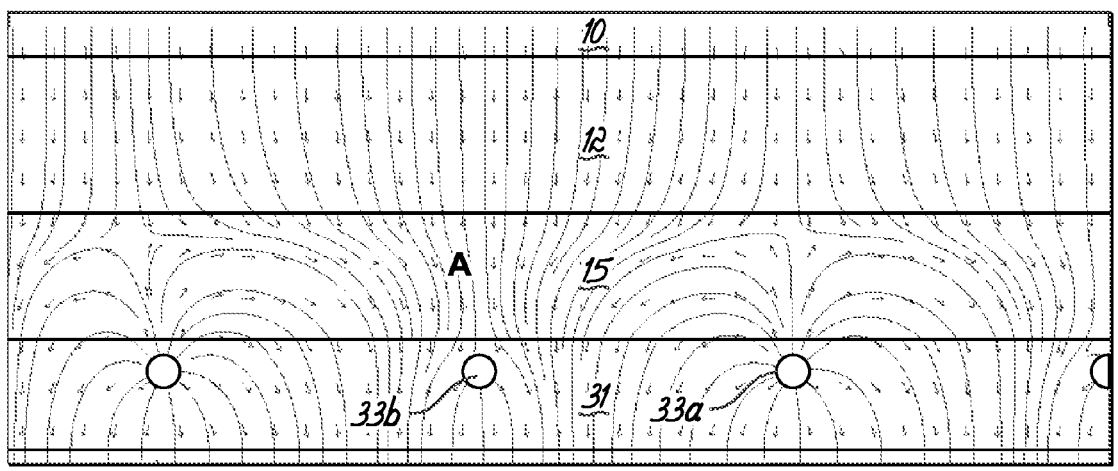
FIG. 10 is a simulation diagram showing electric fields of FIG. 9A.

FIG. 10 is a simulation of the biasing scheme of FIGS. 4A-C and 5A that shows results on potential distribution and electric field between the plasma 10 and the holder electrode 14, through the wafer 15, with the grid structure conductors 33a biased at +50 V and conductors 33b biased at −50 V. The self-bias potential at electrode 14 is taken at about −100 V, and the plasma 10 potential at about 20 V. The electric field lines are focused between two positively biased conductors 33a and 33b (area "A").

Figure 11A:
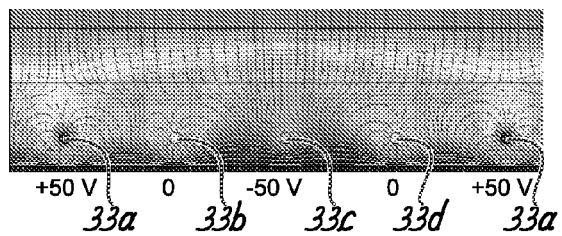
FIGS. 11A-D are simulation diagrams showing electric fields relating to FIGS. 9A-D.
Figure 11D:
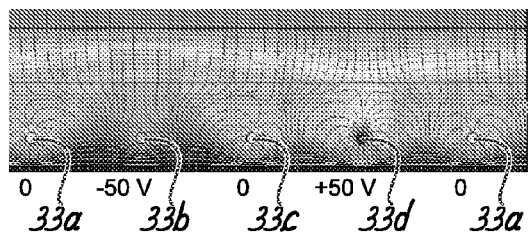
Figure 11B:
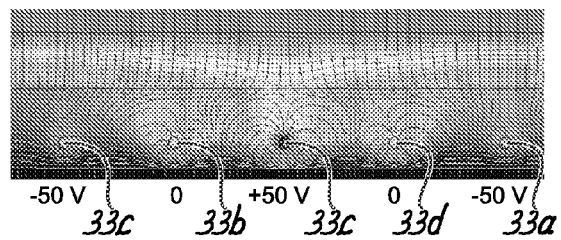
Figure 11C:
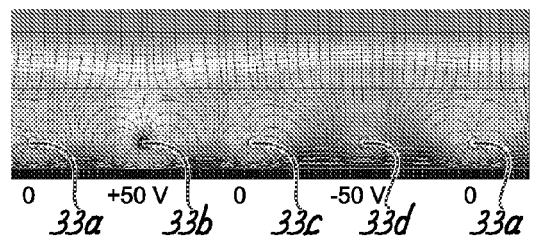

FIG. 1A shows the x-direction electric field and potential distribution with the bias scheme of FIG. 8A at t=π/2 in the cycle (FIG. 9A), where $E_\parallel$ is maximum over conductors 33b and 33d and zero over conductors 33a and 33c. FIG. 11B illustrates the fields with the same scheme at t=3π/2 (FIG. 9B), where $E_\parallel$ is also maximum over conductors 33b and 33d, but reversed in direction, and is also zero over conductors 33a and 33c. FIG. 11C shows the x-direction electric field and potential distribution with the same bias scheme of FIG. 8A at t=5π/2 in the cycle (FIG. 9C), where $E_\parallel$ is maximum over conductors 33a and 33c and zero over conductors 33b and 33d, while FIG. 11D illustrates the fields with the same scheme at t=7π/2 (FIG. 9D), where $E_\parallel$ is also maximum over conductors 33a and 33c, but reversed in direction, and is zero over conductors 33b and 33d. Groups of six or more conductors can be used and switched in pairs to achieve greater smoothing effects.

With the y-direction conductors similarly biased, over a cycle of t=0 to t=4π, the $E_\parallel$ field vector in the sheath will have generally had the same average intensity, direction and presence across the entire wafer. That is, the potential applied to each group of four conductors 33a, 33b, 33c and 33d, generates, within the complete signal sequence or cycle, a parallel electric field above each conductor on the wafer surface. The bias is similarly applied to the y-direction conductors 34a, 34b, 34c and 34d. A phase angle of, for example, π/2 can be imposed between the x and y conductors to create an angularly symmetrical distribution.

The range of frequencies of the grid potential used to alternate the horizontal electric field should be selected to insure that the ions pass from the plasma, through the sheath and onto the wafer, in much shorter time than the polarity switching time of energized conductors. Assuming sheath width to be about 10 mm, plasma potential to be about 20 V, and wafer self-bias to be about −50 V, the time for argon ions to pass through the sheath will be approximately 5.4×10⁻⁷ seconds, which corresponds to a switching time of about 934 kHz. Thus, the frequency of the grid potential should be significantly less than 1 MHz, and practical values suggest around 100 kHz and less. The lower limit for applied frequency is given by the typical processing time in plasma and the type signal sequence. Practical values for frequency should be at least about 10-100 Hz. Different frequencies can be applied to the x and y conductors to achieve such effects as rotating IADFs.

The amplitude of the alternating potential on the grid conductors at the IADF control structure is based on typical voltage characteristics in plasma processing system. With plasma potential in a range of around +15 to 30 V and self-bias from −10 to −100 V, the electric field normal to wafer is about 250 to 1300 V/cm for sheath of about 1 mm in thickness, or 50 to 260 V/cm for a 5 mm sheath thickness. To produce an angle of 10 degrees declination to the normal of the ion incidence vector, a horizontal field of about 44 to 230 V/cm is needed at the wafer surface for a 1 mm sheath, and of about 9 to 46 V/cm for a 5 mm sheath. To produce declination angle 20 degrees, a horizontal field of about 91 to 470 V/cm is needed at the wafer surface for 1 mm sheath, and of about 18 to 94 V/cm for a 5 mm sheath. In that the wafer thickness is about 0.8 mm and the total insulator thickness is several hundreds of micrometers but less than 1 mm, and with the distance between two parallel conductors with opposite potential selected at about 1.4 to several millimeters, the alternating amplitude should be from several volts up to about 100 V, and in extreme cases several 100 s of volts. The most optimal potential value will vary depending on the particular process and can be obtained by experimentation for given plasma process conditions or by simulation.

Figure 12:
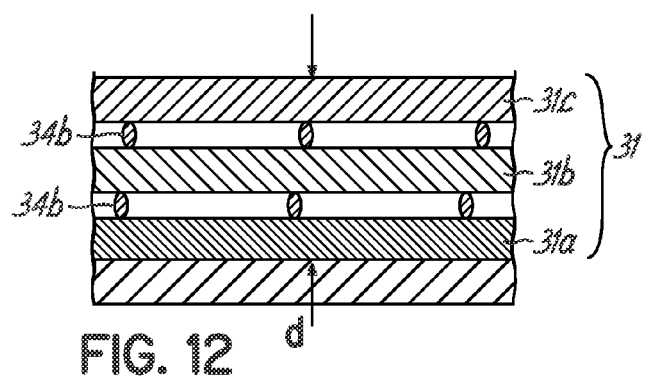
FIG. 12 is a partial cross-sectional view showing the manufacturing detail of the substrate holder of FIG. 3.

The grid for the control of the IADF (FIG. 3) can be formed on the substrate holder by coating the chuck or base electrode 30 with dielectric material using the typical manufacturing methods, such as plasma coating by spraying, thermal CVD, sputtering, etc., as illustrated in FIG. 12. The dielectric materials can be materials like $Al_2O_3$, $Si_3N_4$, SiLK, SiC, etc., with the choice depending on the particular application and the chemistry involved in process. Other suitable polymer materials like PMMA, Teflon may be used as well. The conductive lines are created using a deposition through a mask or reticule, with the pattern of conductors 34 in the y-direction formed of equidistant lines. PVD deposition techniques are typically used. Alternatively, a pattern can be produced by blanket deposition of the metal, applying a photosensitive or photoresist layer, exposing the layer through a mask, developing and then etching the layer to pattern the metal, and then removing the resist.

After the first layer of conductors is applied, the intermediate insulator layer 31b is deposited in a similar manner as the first insulator 31a. Then the conductive pattern of x-direction conductors 33 is applied in a manner similar to that used for application of the conductors 34. Then, a top insulating layer 31c is applied followed by planarization of the coating, and polishing, cleaning, etc. Details of creating buried electrodes in ceramics are known to persons skilled in that technology.

The IADF control is a structured electrode that can be incorporated into the a mono- or bi-polar electrostatic chuck (ESC). The methods of creating buried electrodes in such chucks are known to those skilled in ESC manufacturing. Current ESCs have been designed for wafer size up to 300 mm. The ESCs are coated by suitable insulating material in which RF electrodes and chucking electrodes are buried. Recent ESC designs utilize a single electrode configuration both for RF and ESC biasing. The ESC electrodes used for RF biasing can be used to provide both RF bias and chucking voltage. Either mono- or bi-polar chucks can be used in plasma processing tools. The IADF control or structured electrode can fulfill the function of controlling the ion directionality within a plasma sheath, and can also function as a chucking electrode and an RF biasing electrode. Other electrical biasing can be applied to the structure, for example for heating the wafer by buried heaters, etc.

Figure 13:
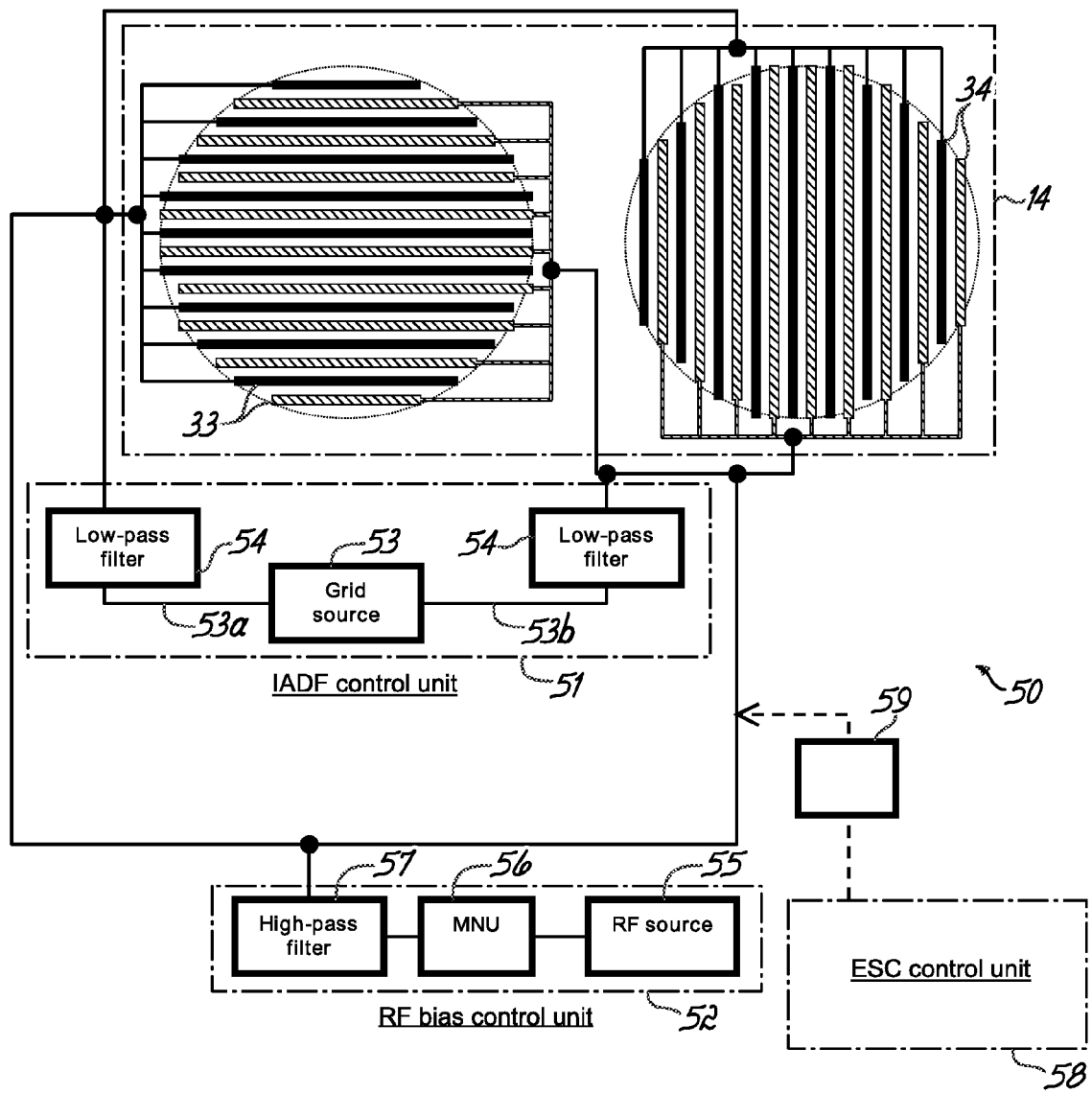
FIG. 13 is a block diagram of one control system for operating a substrate support according to a biasing scheme of FIGS. 4A-D and 5A.

An IADF control system 50 for a IADF control structure 28 as illustrated in the diagram of FIG. 13, which has the sets of conductors 33 and 34 respectively oriented in the x- and y-directions. In each set of the parallel conductors 33 and 34, the odd and even conductors are configured to be biased by alternating potential from an IADF control unit 51. The system 50 also includes an RF bias control unit 52 to bias the same electrode 33 and 34 to use the same electrodes 33 and 34 to apply bias voltage to the chuck 14. The control unit 51 includes an alternating potential source 53, having a direct output 53a and an inverted output 53b, to produce the $E_\parallel$ potential. The RF bias control unit 52 has an RF source 55 connected through a matching network 56 to the electrodes 33 and 34. To prevent the RF signal from the bias control unit 52 from flowing into the IADF control unit 51, low-pass filters 54 connected between the source 53 and the conductors 33 and 34. A high-pass filter 57 is also used to protect a matching network 56 and RF generator 55 from the potential source 53. In lieu of low pass filters 54 and high pass filter 57, notch filters or other isolation schemes can be used.

An ESC control unit 58 is also provided, that may be connected in a similar way to the electrodes 33 and 34 to supply chucking potential. Band-stop filters 59 may be used to avoid interference on the ESC control unit 58 from the lower RF frequency grid potential and at the RF bias frequency (typically 13.56 MHz), though allowing chucking and de-chucking the wafer.

Figure 14:
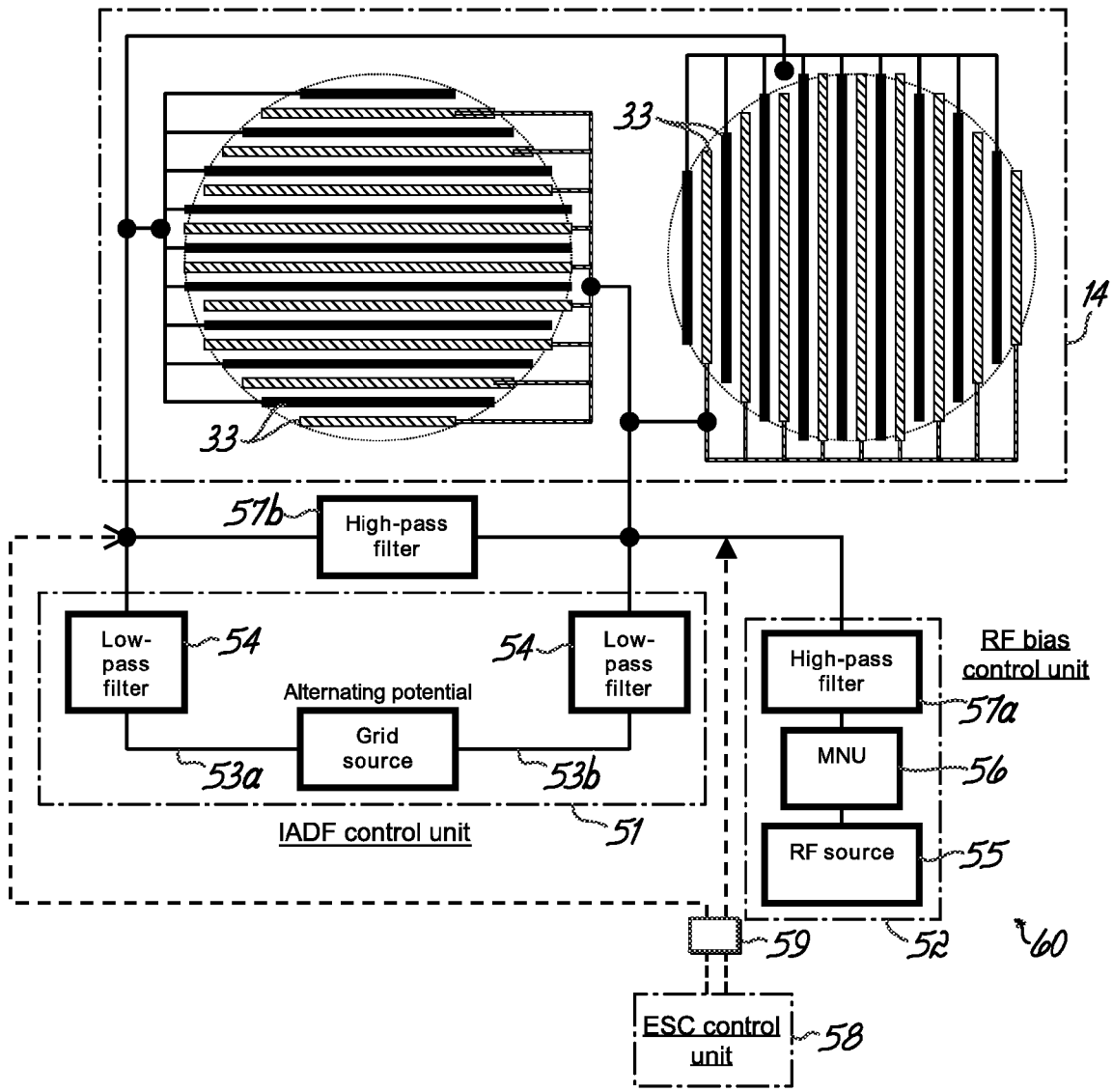
FIG. 14 is a block diagram similar to FIG. 13 of an alternative embodiment of a control system.

Another version of an IADF control system 50 is the system 60 illustrated in FIG. 14 for energizing the sets of conductors 33 and 34 of the IADF control structure 28 in a manner similar to that of system 50 of FIG. 13. The odd and even conductors of each of the sets are biased by alternating potential and supplied from the source 53 of the IADF control unit 51. The RF bias control unit 52 biases the same electrodes 33 and 34. To prevent RF signal to flow into IADF control unit 51, the low-pass filters 54 are provided. Two high-pass filters 57a and 57b can be provided to protect matching network 56 and RF generator 55 in RF bias control unit 52. The ESC control unit 58 is connected in similar way using the band-stop filter 59 to avoid interference of the potential at grid frequency and the RF frequency bias frequency.

Figure 15A:
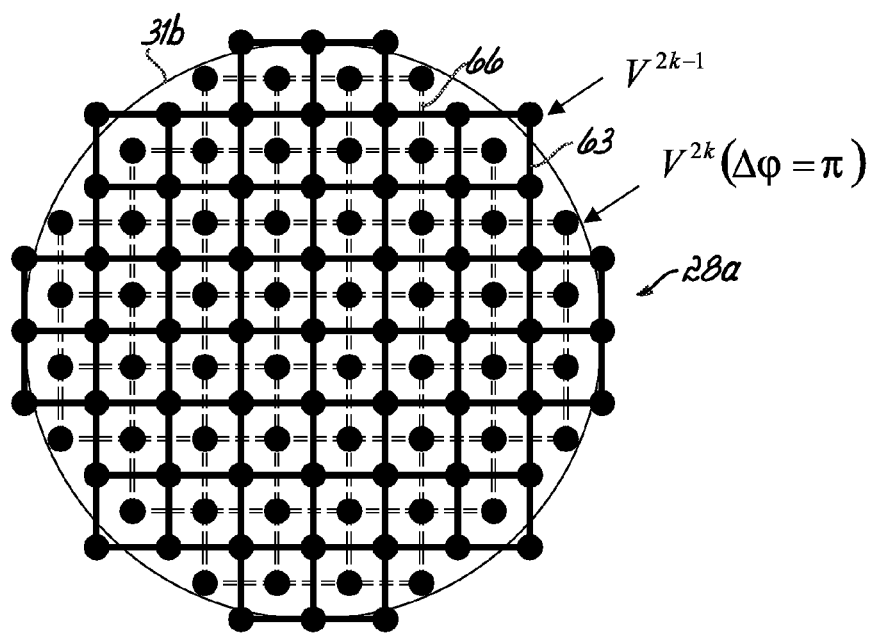
FIG. 15A are is a diagram of biasing grid structure for an alternative embodiment of the wafer support of FIG. 3.
Figure 15C:
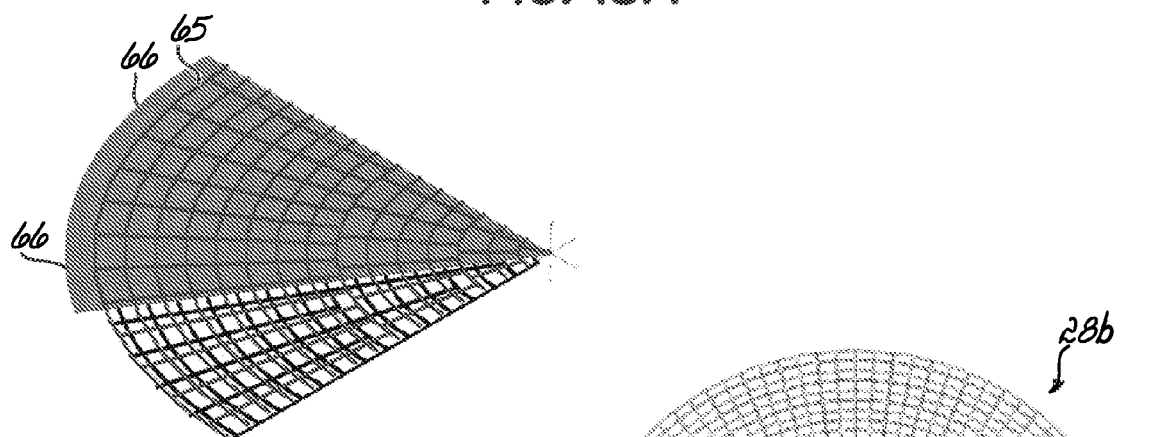
FIG. 15C is a perspective diagram of a section of the grid structure of FIG. 15B.
Figure 15B:
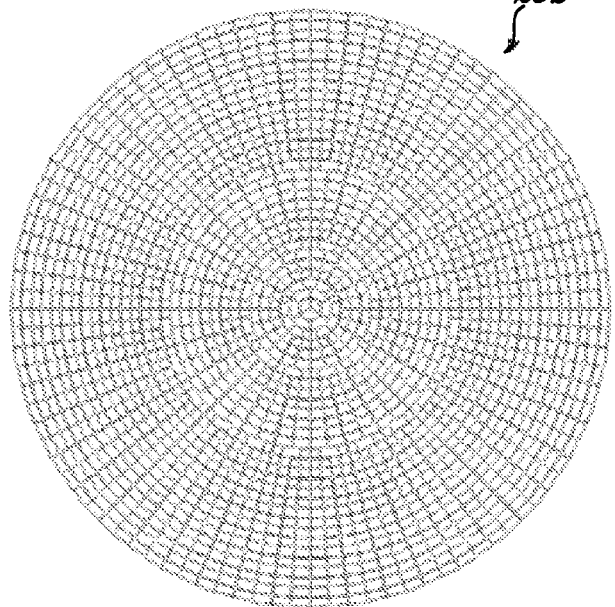
FIG. 15B is a diagram, similar to FIG. 15A, of biasing grid structure for another alternative embodiment of the wafer support.

Alternatives to the IADF structure 28 of FIG. 3 are illustrated in FIG. 15A and in FIGS. 15B and 15C. The embodiment 28a of FIG. 15A has sets of conductors 33 and 34 each arranged in a rectangular arrays 63 and 64, each spaced by the intervening insulator 31b. The circles show connections of two perpendicular wires of the rectangular arrays. The electrode structure 28a has a lower inductance than structure 28, which has an advantage for RF biasing with the same electrodes. The electrical potential can be applied to the structure 28a in the same manner as applied the electrodes of structure 28 by systems 50 and 60 of FIGS. 13 and 14. The opposite polarity is imposed between electrodes 63 and 64. Despite the difference in geometrical configuration, the performance of the structure 28 and 28a will be similar.

Another embodiment for the IADF control structure 28 is the structure 28b shown in FIGS. 15B and C, in which radial grids or arrays 65 and 66 replace the rectangular array 63 and 64, of structure 28a, each formed of concentric circular conductors connected to radial conductors, with conductors 65 and 66 separated by the intermediate dielectric layer 31b. With the structure 28b, the opposite polarity conductors is imposed between the two conductor arrays 65 and 66. Other combinations of structures can be used according to principles of the present invention.

The structures 28a and 28b perform similar to the electrodes described in connection with FIGS. 4A and 4B, which are described for simplicity. Performance similar to that of FIGS. 9A-D can result by doubling each of the arrays and separately controlling each in accordance with the signals of FIG. 8A. This is achieved by use of a version of the control system 50, such as control system 70 illustrated in FIG. 16. In the control system 70, the doubled sets of the conductors 33 and 34 each contains multiple groups of four conductors 33a-33d and 34a-34d, respectively, energized by IDAF control unit 71 according to the signals of FIG. 8A. Conductors 33a, 34a and 33c, 34c of grid are biased by alternating potential supplied by the grid source 53, with the conductors 33a and 34a being biased through a low pass filter 54 from the direct output 53a of the grid supply 53 while the conductors 33c and 34c are biased through a low pass filter 54 from the grid supply 53 through an inverter 53b. Conductors 33b, 34b and 33d, 34d of each grid are biased by alternating potential and supplied through a 2π phase shifts or delays 73 and 74 from grid source 53, with the conductors 33b and 34b being biased through a low pass filter 54 from the direct output 53a of the grid supply 53 while the conductors 33d and 34d are biased through a low pass filter 54 from the grid supply 53 through an inverter 53b. As such, the biasing of pairs 33a and 33b, and pairs 34a and 34b, is alternated with the biasing of pairs 33c and 33d, and pairs 34c and 34d. That means the a-b pairs are biased when the c-d pairs are at zero potential, and the c-d pairs are biased when pairs a-b are at zero potential, as in FIG. 8A, or similarly as in FIG. 8B.

Figure 16:
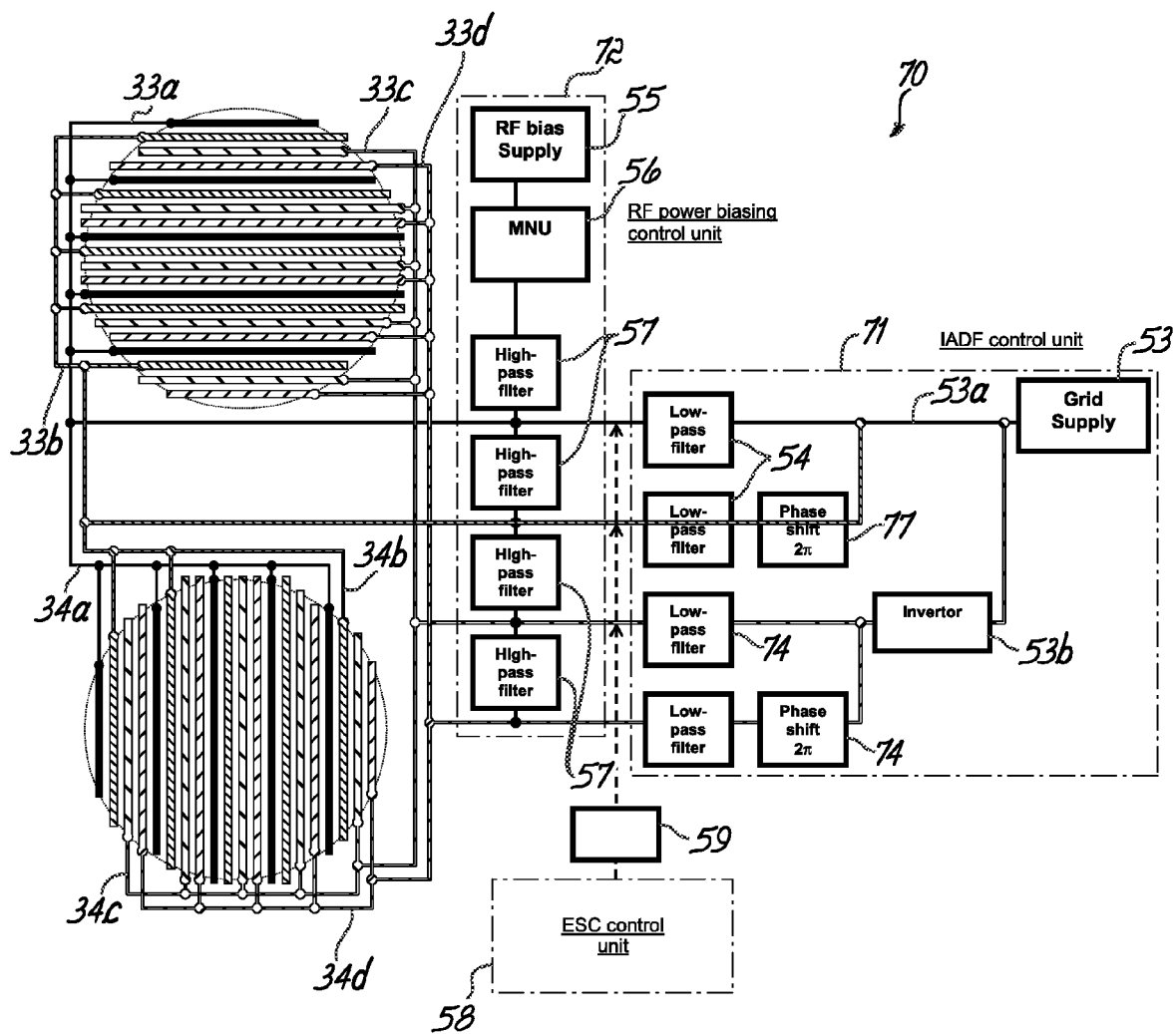
FIG. 16 is a block diagram of one control system for operating a substrate support according to a biasing scheme of FIGS. 9A-D and 8A.

Also in FIG. 16, the RF bias control unit 52, equipped with high pass filters 57, can be used to bias the same electrode as IADF control unit 71 does. To prevent RF signal to flow into the IADF control unit 71, the low-pass filters 54 are used, while the high-pass filters 57 are used to protect the matching network 56 and RF generator 55. The ESC control unit 58 is connected in a similar way as in FIGS. 13 and 14 through band-stop filter 59 to avoid interference of the potential at grid frequency, though allowing chucking and de-chucking the wafer.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of controlling the angular distribution of ions incident onto the surface of a semiconductor wafer on an RF biased substrate holder during plasma processing, comprising:

applying opposite and alternating potentials across pairs of conductors below the wafer supporting surface of a substrate holder in a plasma processing apparatus, wherein the pairs of conductors lie in a plane parallel to the wafer supporting surface;

creating with the applied opposite and alternating potentials, at one or more points on the wafer supporting surface, an electric field directed parallel to the surface of a semiconductor wafer supported on the substrate holder; and impinging ions from a plasma across a plasma sheath and through the created electric field onto the surface of the semiconductor wafer while controlling the applied opposite and alternating potentials to affect the angular distribution of ions impinging onto the semiconductor wafer over the one or more points on the wafer supporting surface.

2. The method of claim 1 wherein:

the applying of opposite and alternating potentials includes varying the potentials applied across different pairs of conductors below the wafer supporting surface of the substrate holder, to create changing electric fields parallel to the surface of the semiconductor wafer at the one or more points on the wafer supporting surface.

3. The method of claim 2 wherein:

the applying of opposite and alternating potentials includes switching or phasing the application of opposite and alternating potentials among different pairs of conductors, to create electric fields parallel to the surface of the semiconductor wafer across the surface of the wafer.

4. The method of claim 3 wherein:

the applying of opposite and alternating potentials includes switching or phasing the application of opposite and alternating potentials differently among different pairs of conductors of each of two different coordinate sets of conductors below the wafer supporting surface of the substrate holder; and the creating of the electric field parallel to the surface of a semiconductor wafer includes creating changing electric fields parallel to the surface of the semiconductor wafer in two dimensions parallel to the surface of a semiconductor wafer supported on the substrate holder.

5. The method of claim 2 wherein:

the applying of opposite and alternating potentials includes differently varying the potentials applied across different pairs of conductors of each of two different coordinate sets of conductors below the wafer supporting surface of the substrate holder; and the creating of the electric field parallel to the surface of a semiconductor wafer includes creating changing electric fields parallel to the surface of the semiconductor wafer in two dimensions parallel to the surface of a semiconductor wafer supported on the substrate holder.

6. The method of claim 1 wherein:

the applying of opposite and alternating potentials includes applying opposite and alternating potentials across pairs of conductors of each of two different coordinate sets of conductors below the wafer supporting surface of the substrate holder; and the creating of an electric field parallel to the surface of a semiconductor wafer includes creating with the applied opposite and alternating potentials at the one or more points on the wafer supporting surface, an electric field in two dimensions parallel to the surface of the semiconductor wafer supported on the substrate holder.

7. The method of claim 1 further comprising:

providing a plurality of conductors in each of two dimensions below the surface of the substrate holder;

applying signals to first conductors in each dimension and inverted signals to second conductors in each dimension to create electric fields parallel to the surface of the semiconductor wafer over areas on the surface of the semiconductor wafer between the first and the second conductors.

8. The method of claim 7 further comprising:

applying signals to third conductors in each dimension and inverted signals to fourth conductors in each dimension to create electric fields parallel to the surface of the semiconductor wafer over areas on the surface of the semiconductor wafer between the third and the fourth conductors; and controlling the applying of the signals between the first and the second conductors in each dimension to create electric fields parallel to the surface of the semiconductor wafer over the third and the fourth conductors, and controlling the applying of the signals between the third and the fourth conductors in each dimension to create electric fields parallel to the surface of the semiconductor wafer over the first and the second conductors.

9. The method of claim 7 wherein:

controlling the applying of the signals includes controlling the applying of the signals between different conductors in each dimension to create electric fields parallel to the surface of the semiconductor wafer across areas between the conductors and over the conductors.

10. The method of claim 7 wherein:

controlling the applying of the signals includes controlling the applying of the signals between different conductors in each dimension to create time-averaged electric fields parallel to the surface of the semiconductor wafer that are generally uniform across areas between the conductors and over the conductors.

11. The method of claim 7 wherein:

controlling the applying of the signals includes controlling the applying of the signals between different conductors in each dimension to create electric fields parallel to the surface of the semiconductor wafer that are present during at least a portion of a control cycle and across areas between and over the conductors.

12. The method of claim 1 further comprising:

applying an RF bias potential to the semiconductor wafer on the substrate holder by energizing the pairs of conductors.

13. The method of claim 1 further comprising:

electrostatically clamping the semiconductor wafer to the substrate holder by applying electrostatic potentials to the pairs of conductors.

14. The method of claim 1 further comprising:

applying the opposite and alternating potentials with an alternating potential generator connected across the pairs of the conductors and producing the electric field close to and parallel to the semiconductor wafer.

15. The method of claim 14 wherein:

the applying of the opposite and alternating potentials with the alternating potential generator includes applying the electric field differently in two dimensions parallel to the semiconductor wafer.

16. The method of claim 15 further comprising:

controlling the alternating potential generator to change the electric fields in the two dimensions across the semiconductor wafer, and to phase the electric fields in the two dimensions to increase the uniformity of the average electric field in all directions across the semiconductor wafer.

17. The method of claim 7 wherein:

the applying of the signals includes applying the signals to the plurality of conductors differently in each dimension, to affect the angular distribution of ions impinging onto the semiconductor wafer differently in two dimensions parallel to the semiconductor wafer.

18. The method of claim 8 wherein:

the applying of the signals includes applying the signals to the plurality of conductors differently in each dimension, to affect the angular distribution of ions impinging onto the semiconductor wafer differently in two dimensions parallel to the semiconductor wafer.

19. The method of claim 9 wherein:

the applying of the signals includes applying the signals to the plurality of conductors differently in each dimension.

20. The method of claim 10 wherein:

the applying of the signals includes applying the signals to the plurality of conductors differently in each dimension.

* * * * *